US008941435B2

(12) United States Patent
Dohi et al.

(10) Patent No.: US 8,941,435 B2
(45) Date of Patent: Jan. 27, 2015

(54) CONTROL PANEL

(71) Applicant: U-Shin Ltd., Tokyo (JP)

(72) Inventors: Izumi Dohi, Hiroshima (JP); Kazuyuki Fukushima, Hiroshima (JP)

(73) Assignee: U-Shin Ltd., Tokyo (JP)

( * ) Notice: Subject to any disclaimer, the term of this patent is extended or adjusted under 35 U.S.C. 154(b) by 0 days.

(21) Appl. No.: 14/314,712

(22) Filed: Jun. 25, 2014

(65) Prior Publication Data
US 2015/0002212 A1 Jan. 1, 2015

(30) Foreign Application Priority Data

Jun. 28, 2013 (JP) .................................. 2013-136465

(51) Int. Cl.
H03K 17/96 (2006.01)
(52) U.S. Cl.
CPC .................................. *H03K 17/9618* (2013.01)
USPC ......................................................... 327/517
(58) Field of Classification Search
USPC .................................................. 327/516, 517
See application file for complete search history.

(56) References Cited

U.S. PATENT DOCUMENTS 8,841,957 B2 * 9/2014 Gillespie ....................... 327/517

FOREIGN PATENT DOCUMENTS

JP 2011051427 3/2011

* cited by examiner

*Primary Examiner* — Hai L Nguyen
(74) *Attorney, Agent, or Firm* — BainwoodHuang

(57) ABSTRACT

Techniques reduce erroneous judgment due to effects of noise accompanying PWM control. LEDs light operating portions and function as indicators. Circuitry adjusts brightness of the LEDs through PWM control. A detecting circuit outputs detected values in accordance with electrostatic capacitances of the electrode. A CPU senses a touch operation when a difference between a detected value of the detecting circuit and a reference value is more than a prescribed value. The CPU stores a detected value as a reference value which is the first value detected by the detecting circuit after the PWM control execution state of the LEDs has been changed or the first value that is detected by the detecting circuit, which is comprised by a touch switch that is in a specified positional relationship with respect to the touch switch which executing state of PWM control of the LEDs has changed, after transition of the executing state.

4 Claims, 11 Drawing Sheets

FIG. 4

| OPERATING PORTION NUMBER | ASSOCIATED INDICATOR FLAG |
|---|---|
| 1 | — |
| 2 | — |
| 3 | — |
| 4 | Fc-9,Fc-10 |
| 5 | Fc-11,Fc-12 |
| 6 | Fc-11,Fc-12 |
| 7 | Fc-8,Fc-12 |
| 8 | Fc-8,Fc-9,Fc-15 |
| 9 | Fc-8,Fc-9,Fc-10,Fc-15,Fc-16 |
| 10 | Fc-9,Fc-10,Fc-15,Fc-16 |
| 11 | Fc-11,Fc-12 |
| 12 | Fc-11,Fc-12 |
| 13 | Fc-8,Fc-12 |
| 14 | Fc-8,Fc-9,Fc-15 |
| 15 | Fc-8,Fc-9,Fc-10,Fc-15,Fc-16 |
| 16 | Fc-9,Fc-10,Fc-15,Fc-16 |

CONTROL PANEL

CROSS REFERENCE TO RELATED APPLICATIONS

This application is based on and claims the benefit of priority to Japanese Patent Application No. 2013-136465, filed on Jun. 28, 2013, the contents and teachings of which are hereby incorporated by reference in their entirety.

TECHNICAL FIELD

The present invention relates to an electrostatic capacitance type touch switch that detects touch operations of a conductive body such as a human body through changes in electrostatic capacitance and to a control panel comprising a plurality of such touch switches.

BACKGROUND ART

Control panels for air conditioning operations in vehicles are comprised with light-emitting diodes to make letters and symbols indicating functions allotted to switches easily readable and to display operating conditions of the switches. There are known brightness adjusting functions such as reducing the brightness of light-emitting diodes at night times. For realizing such brightness adjusting functions, PWM (pulse width modulation) control is generally employed which requires a small number of parts and involves low costs.

Touch switches of electrostatic capacitance type are widely used in these years due to reasons that they can realize simple designs free of unevenness and that they are free of malfunctions caused through wear of switch contacts.

Touch switches of electrostatic capacitance type include electrodes that are disposed proximate of operating portions that are subject to touch operations. Touch operations are detected based on changes in electrostatic capacitances in accordance with a conductive body such as a human body approaching these electrodes.

More particularly, detected values of sizes that are in accordance with electrostatic capacitances of the electrodes are obtained at constant time intervals by a detecting circuit. When a difference between the latest detected value and a reference value is less than a prescribed difference value $\Delta a$, it is judged that no touch operations have been made, and the reference value is updated to the latest detected value. When a difference between the latest detected value and a reference value is not less than a prescribed difference value $\Delta a$, it is judged that a touch operation has been made, and the reference value is not updated.

FIG. 9 is a time chart showing one example of changes in detected values.

In this case, while reference values are replaced by the latest detected values up to time point T11, the reference value is constant at Ra since the detected values Ra are constant.

At time point T12, since the difference between the latest detected value and the reference value is not less than the prescribed difference value $\Delta a$, the reference value is not updated but remains Ra. Accordingly, since all of the differences between the latest detected values and the reference values will be not less than the prescribed difference value $\Delta a$ until to the next time point T13, the reference value is not updated but remains Ra.

While the reference value is updated at time point T14 since the difference between the latest detected value and the reference value Ra is less than the prescribed difference value $\Delta a$, the reference value remains Ra since the latest detected value is Ra.

In this manner, the reference remains almost constant at Ra, and touch operations are detected during period P11 between time point T12 and time point T14.

CITATION LIST

Patent Literature

Patent Literature 1: Japanese Unexamined Patent Application Publication No. 2011-51427

SUMMARY OF THE INVENTION

Technical Problem

When the above-mentioned touch switches of electrostatic capacitance type are used in an air conditioning control panel of a vehicle, light-emitting diodes are disposed proximate of electrodes of the touch switches. In performing brightness adjustment of the light-emitting diodes through PWM control in such a configuration, variations in electrostatic capacitance of the electrodes will become large due to noise generated thereby so that there is the fear that erroneous judgments of touch operation Occur.

While it is possible to reduce the above-mentioned effects of noise by employing a method of disposing the light-emitting diodes to be remote from the electrodes or a method of performing brightness adjustment by controlling amperages of the light-emitting diodes, both methods will result in an increase in the number of parts and thus in increased costs.

It is accordingly a purpose of the present invention to reduce the danger that erroneous judgments are made due to influences of noise accompanying PWM control while using PWM control for brightness adjustment of light-emitting diodes disposed proximate of electrodes.

Solution to Problem

For achieving the above purpose, the first invention is configured in that a control panel comprising a plurality of touch switches and a control unit, each of the plurality of touch switches comprising: operating portions that are subject to touch operations by a conductive body, electrodes disposed proximate of the operating portions, light-emitting elements that light up the operating portions, a first brightness adjusting unit that performs brightness adjustment of the light-emitting elements through PWM (pulse width modulation) control, and a detecting circuit that outputs a detected value in accordance with electrostatic capacitances of the electrodes, a part of the plurality of touch switches further comprising: light-emitting elements for indicators representing states of functions allotted to the operating portions through lighting states, and a second brightness adjusting unit that performs brightness adjustment of the light-emitting elements for indicators through PWM control, the control unit comprising: a memory device that stores reference values for each of the plurality of touch switches, a judging unit that judges for each of the plurality of touch switches that a touch operation has been made for a corresponding touch switch when a difference between a detected value detected by the detecting circuit that the corresponding touch switch comprises and a reference value for the corresponding touch switch that is stored in the memory device is not less than a prescribed value, and a reference value updating unit that stores a detected value, which is the first value detected by the detecting circuit after transition of the executing state of the PWM control by the first brightness adjusting unit, or a detected value, which is the first value detected by the detecting circuit, which is comprised by a touch switch that is in a specified positional relationship with respect to the touch switch which executing state of PWM control by the second brightness adjusting unit has changed, after transition of the executing state of the PWM control by the second brightness adjusting unit, in the memory device as the reference value for the touch switch comprising the detecting circuit.

For achieving the above purpose, the second invention is configured in that the reference value updating unit of the first invention does not update the reference value of a touch switch which is not in the specified positional relationship with the touch switch which executing state of PWM control by the second brightness adjusting unit has changed.

For achieving the above purpose, the third invention is configured in that when the judging unit judges that the touch operation has been made to any of the plurality of touch switches when the detecting circuit makes a first detection after transition of the executing state of PWM control by the first or second brightness adjusting unit, the reference value updating unit of the first invention stores the first detected value, which is detected by the detecting circuit after the judging unit has judged that no touch operation have been made to any of the plurality of touch switches thereafter, as the reference value in the memory device.

For achieving the above purpose, the fourth invention is configured in that the reference value updating unit of the first invention confirms for each of the plurality of touch switches whether any one of a part of touch switches, which are preliminarily determined for each of the touch switches is in a peripheral touched state for which it is judged by the judging unit that they are being touch operated are not, and stores the first detected value, which is detected by the detecting circuit after the peripheral touched state has been cancelled for the touch switches in the peripheral touched state thereafter, as the reference value in the memory device.

Effects of Invention

According to the present invention, it is possible to reduce the danger that that erroneous judgments are made due to influences of noise accompanying PWM control.

BRIEF DESCRIPTION OF DRAWINGS

FIG. 4 is a schematic diagram of a flag associating table.

DETAILED DESCRIPTION OF PREFERRED EMBODIMENTS

Embodiments of the present invention will now be explained while referring to FIG. 1 to FIG. 11.

In this respect, while embodiments will be explained here in which the present invention is applied to a control panel for air conditioning operations in a vehicle, the present invention is similarly applicable to control panels for other purposes.

Figure 1:
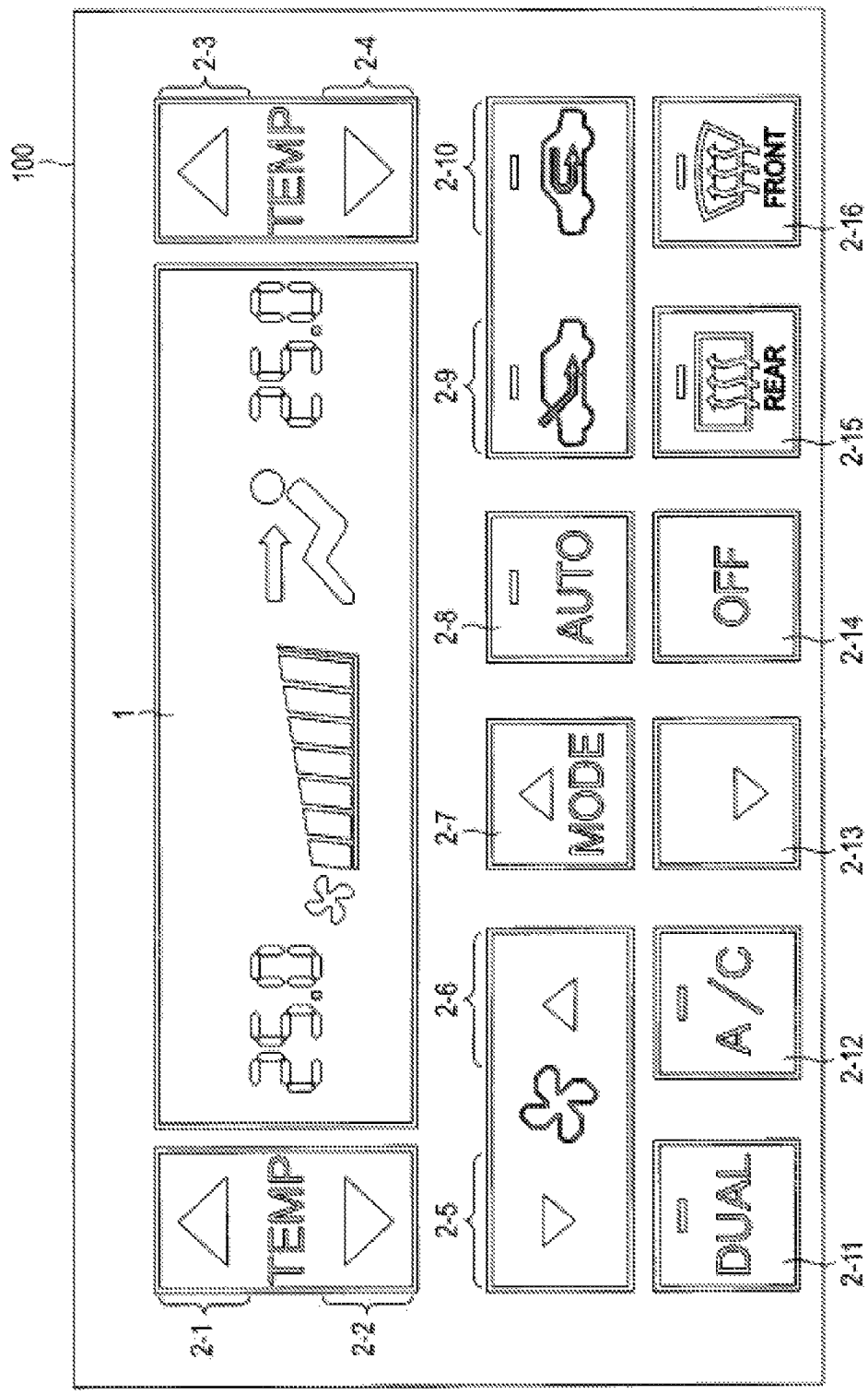
FIG. 1 is a plan view showing an external appearance of an operating surface of a control panel according to one embodiment.

FIG. 1 is a plan view showing an external appearance of an operating surface of a control panel 100 according to the present embodiment.

The control panel 100 comprises a display device 1 and sixteen operating portions 2 which are in a state in which they are exposed to the exterior on an operating surface thereof. In this respect, in FIG. 1, the respective operating portions are represented by reference numbers 2-1 to 2-16 in which operating portion numbers ranging from "1" to "16" are added as suffixes. In this respect, when it is not necessary to individually distinguish the operating portions, they are described as "operating portion(s) 2" while when it is necessary to individually distinguish the operating portions, they are described as, for instance, "operating portion 2-1".

The display device 1 is, for instance, a liquid crystal panel device and displays images representing working conditions of an air conditioning device in a vehicle.

The operating portions 2 are portions which are to be touch operated by an operator on the operating surface. Some portions of the operating portions 2 form letters, symbols or indicator windows by using a translucent material, and other portions are formed by using a lightproof material.

One electrode and at least one light-emitting diode are respectively disposed to oppose each of the operating portions 2 within the control panel 100.

Figure 2:
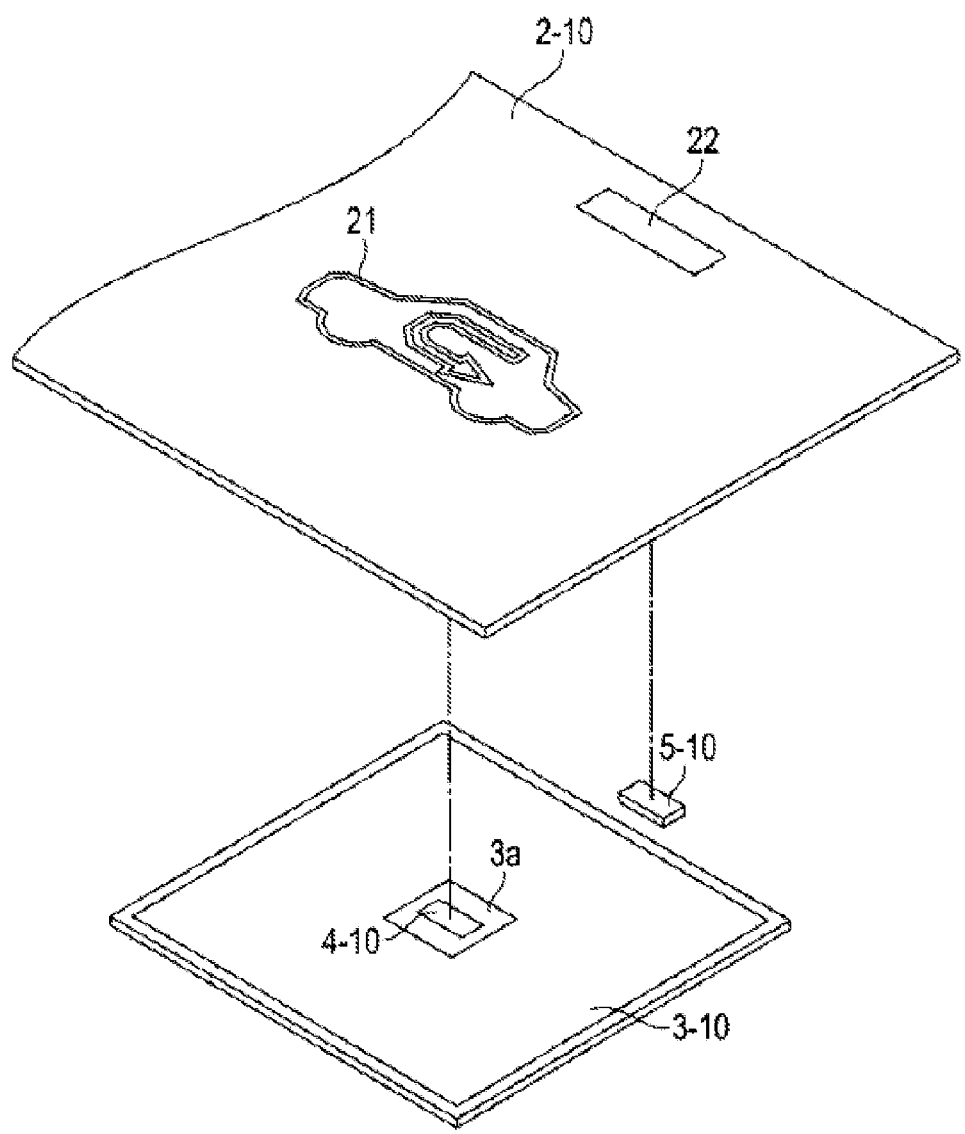
FIG. 2 is an exploded perspective view representing positional relationships between operating portions and electrodes as well as light-emitting diodes.

FIG. 2 is an exploded perspective view representing positional relationships between the operating portion 2 and an electrode 3 as well as light-emitting diodes 4 and 5.

In this respect, FIG. 2 shows a configuration related to operating portion 2-10. Further, the electrode 3 and the light-emitting diodes 4, 5 are also represented by reference numbers added with the same suffixes as the operating portion 2-10, that is, 3-10, 4-10 and 5-10 in FIG. 2. In this respect, when it is not necessary to individually distinguish the electrodes and light-emitting diodes, they are described as "electrode(s) 3", "light-emitting diode(s) 4" and "light-emitting diode(s) 5" while when it is necessary to individually distinguish them, they are described as "electrode 3-1", "light-emitting diode 4-1" and "light-emitting diode 5-1".

The operating portion 2-10 is formed with a symbol 21 and an indicator window 22 using a translucent material. The symbol 21 includes a contour of a car and a U-shaped arrow and represents that the operating portion 2-10 is for selecting an interior air circulation mode. The indicator window 22 represents a set/reset (non-set) state of the interior air circulation mode by emitting/non-emitting light.

The electrode 3-10 is formed in a thin sheet-like or thin film-like form using a conductive material. A front surface of the electrode 3-10 opposes the operating portion 2-10. An aperture 3a is formed in a center of the electrode 3-10.

The light-emitting diode 4-10 is disposed within the aperture 3a such that its light-emitting surface faces the operating portion 2-10. The light-emitting diode 4-10 opposes the symbol 21 and lights the symbol 21. In this respect, it is possible to use a different type of light-emitting element instead of the light-emitting diode 4-10.

The light-emitting diode 5-10 is disposed sideward of the electrode 3 such that its light-emitting surfaces faces the operating portion 2-10. The light-emitting diode 5-10 opposes the indicator window 22 and lights the indicator window 22. In this respect, it is possible to use a different type of light-emitting element instead of the light-emitting diode 5-10.

In this manner, the light-emitting diode 4 is one example of a light-emitting element for lighting provided to lighten the touch switch and the light-emitting diode 5 is a one example of a light-emitting element for the indicator provided to represent states such as modes that are operated by the touch switch.

While illustration is omitted here, other operating portions 2 of the control panel 100 are of similar configuration as that of FIG. 2. However, symbols of different shapes are provided instead of the symbol 21 for the other operating portions 2. Further, no indicator windows 22 are formed for the operating portions 2-1, 2-2, 2-3, 2-4, 2-5, 2-6, 2-7, 2-13, 2-14, and no light-emitting diodes 5 are provided to oppose these operating portions 2-1, 2-2, 2-3, 2-4, 2-5, 2-6, 2-7, 2-13, 2-14. In other words, sixteen light-emitting diodes 4-1 to 4-16 are provided to oppose each of the sixteen operating portions 2, and seven light-emitting diodes 5-8, 5-9, 5-10, 5-11, 5-12, 5-15, 5-16 are provided to oppose each of the operating portions 2-8, 2-9, 2-10, 2-11, 2-12, 2-15, 2-16.

Figure 3:
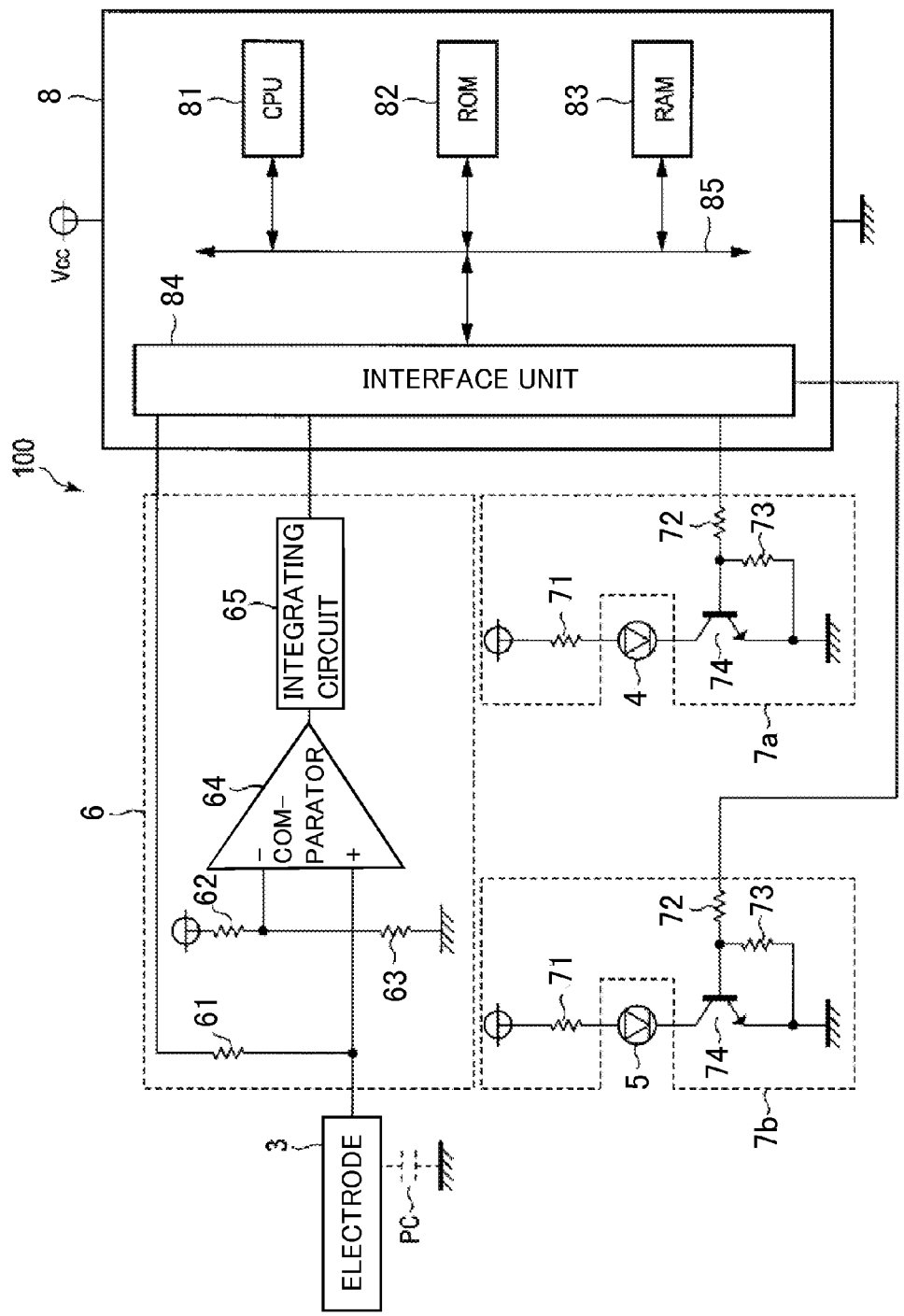
FIG. 3 is a view showing a part of electric elements of the control panel according to the embodiment as shown in FIG. 1.

FIG. 3 is a view showing a part of electric elements of the control panel 100.

It should be noted that elements in FIG. 3 that are identical to those of FIG. 2 are marked with the same reference numbers.

As shown in FIG. 3, the control panel 100 includes a detecting circuit 6, driving circuits 7a, 7b and a control unit (or circuit) 8 (i.e., each touch switch includes the various listed components and the control unit is common for each touch switch). In this respect, while the electrode 3, the light-emitting diode 4, the detecting circuit 6 and the driving circuit 7a individually include elements corresponding to each of the operating portions 2-1 to 2-16, and the light-emitting diode 5 and the driving circuit 7b individually include elements corresponding to each of the operating portions 2-8, 2-9, 2-10, 2-11, 2-12, 2-15, 2-16, only one of the electrode 3, the light-emitting diodes 4, 5, the detecting circuit 6 and the driving circuit 7a are shown in FIG. 3.

The detecting circuit 6 is a known circuit including resistors 61, 62, 63, a comparator 64 and an integrating circuit 65 which obtains detected values in accordance with electrostatic capacitance sizes of the electrode 3 and which sends the detected values to the control unit 8.

The driving circuits 7a, 7b are known circuits respectively including resistors 71, 72, 73 and a transistor 74. The driving circuit 7a drives the light-emitting diode 4 by being controlled by the control unit 8. The driving circuit 7b drives the light-emitting diode 5 by being controlled by the control unit 8. The driving circuits 7a, 7b perform brightness adjustment of the light-emitting diodes 4, 5 that are subject to driving through PWM control. While the range of brightness adjustment is arbitrary, PWM control is performed even if the brightness is maximal in the present embodiment. In other words, a maximum value of the range of brightness adjustment is defined to be a value that is smaller than the brightness that is obtained through continuous electrification of the light-emitting diodes 4, 5. Accordingly, the driving circuits 7a, 7b are in a PWM control mode when corresponding light-emitting diodes are lightened. The driving circuits 7a, 7b are examples of first and second brightness adjusting unit (or circuit).

The control unit 8 includes a CPU (central processing unit) 81, a ROM (read-only memory) 82, a RAM (random-access memory) 83, an interface unit (or circuit) 84 and a bus line 85. Each of the CPU 81, the ROM 82, the RAM 83 and the interface unit 84 is connected to the bus line 85. In other words, it is possible to use, for instance, a microcomputer as the control unit 8.

The CPU 81 performs processes for judging presence/absence of touch operations to each of the operating portions 2, for switching the light-emitting diodes ON/OFF and for brightness adjustment of light-emitting diodes 4, 5 in accordance with programs stored in the ROM 82.

The ROM 82 stores the above-mentioned programs and various data that the CPU 81 refers to in performing various processes. The ROM 82 also stores a flag associating table to be described later.

The RAM 83 is used as a working area for temporally storing data when the CPU 81 performs various processes.

The interface unit 84 provides square waves to one port of the resistor 61 of the detecting circuit 6. The interface unit 84 takes in detected data that are output from the integrating circuit 65 of the detecting circuit 6. The interface 84 outputs switching signals to the driving circuits 7a, 7b. In this respect, the detecting circuits and the driving circuits for other operating portions are also connected to the interface circuit 84. The interface unit 84 performs the same operations as mentioned above for those detecting circuits and driving circuits.

In this manner, a single touch switch is configured to include the operating portion 2, the electrode 3, the light-emitting diodes 4, 5, the detecting circuit 6, the driving circuits 7a, 7b and the control unit 8. Sixteen touch switches related to each of the operating portions 2-1 to 2-16 are thus configured. However, touch switches related to the operating portions 2-1 to 2-7 and 2-13, 2-14 do not comprise the light-emitting diode 5 and the driving circuit 7.

In this respect, voltage Vb is a voltage output by a battery mounted in the vehicle which is, for instance, 12V. The voltage Vb is either supplied when a key position is at an ignition position or is continuously supplied irrespective of the key position. Voltage Vcc is a voltage obtained by transforming the voltage output by the battery which is, for instance, 5V.

FIG. 4 is a schematic diagram of a flag associating table.

It is recited in the flag associating table, in association with each of the operating portion numbers, which of the sixteen indicator flags Fc is associated with the operating portion 2 allotted with the operating portion numbers. In this respect, when it is not necessary to individually distinguish the indicator flags, they are described as "indicator flag(s) Fc" while when it is necessary to individually distinguish the indicator flags, they are described as, for instance, "indicator flag Fc-1".

More particularly, the flag associating table as shown in table in FIG. 4 represents that indicator flags Fc-9, Fc-10, Fc-15, Fc-16 are associated with the operating portion 2-10 which operating portion number is "10".

Operations of the thus configured control panel 100 will now be explained.

First Operating Example

Figure 5:
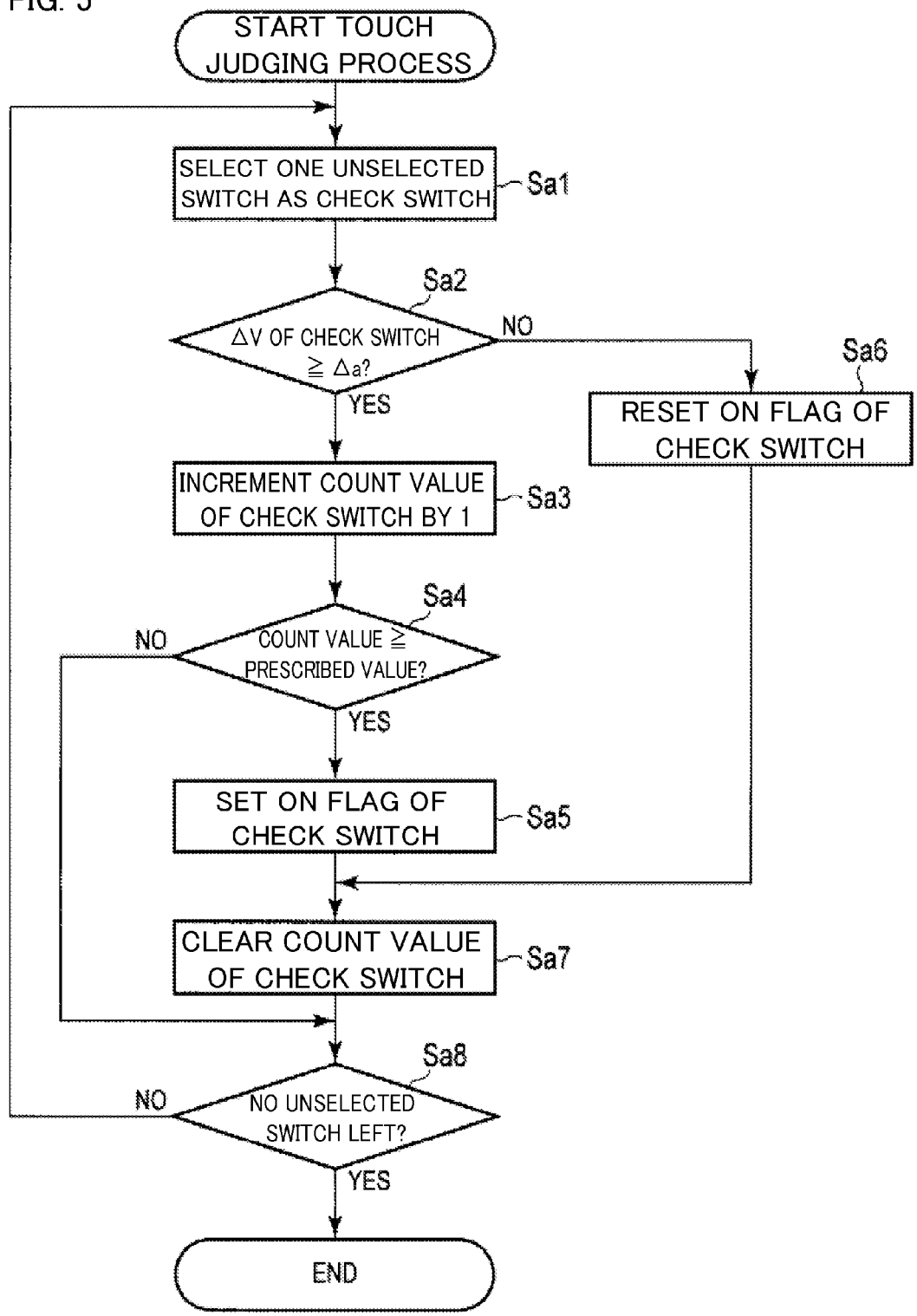
FIG. 5 is a flowchart of a touch judging process performed by a CPU in FIG. 3.

The CPU 81 repeatedly starts touch judging processes as shown in FIG. 5 at constant time intervals.

In step Sa1, the CPU 81 selects one out of all touch switches that the control panel 100 comprises that has not been selected yet in the current touch judging process as a check switch.

In step Sa2, the CPU 81 confirms whether a detected value difference $\Delta V$ of the check switch is not less than a prescribed difference value $\Delta a$ or not. Here, the detected value difference $\Delta V$ is a difference between a detected value that is output by the detected circuit 6 included in the check switch at this point of time and a reference value determined for the check switch through a reference value updating process to be described later. In this respect, reference values are stored in the RAM 83 for each of the plurality of touch switches. The RAM 83 is accordingly one example of a memory device. It is also possible to provide a volatile memory device such as an EEPROM other than the RAM 83 in order to store reference values therein.

In principle, the detecting circuit 6 outputs detected values of sizes that are in accordance with electrostatic capacitances related to the electrode 3. Parasitic capacitances (stray capacitances) PC that are generated between the electrode and a ground pattern formed on the printed circuit board are constantly present as the electrostatic capacitances related to the electrode 3. When a conductive body such as a human body approaches the electrode 3, electrostatic capacitance is generated between the conductive body and the electrode 3. Since the thus generated electrostatic capacitance is larger than the parasitic capacitance PC, the electrostatic capacitance related to the electrode 3 will largely vary depending on the presence/absence of an approaching conductive body. While sizes of the electrostatic capacitance generated between the conductive body and the electrode 3 changes depending on the conductivity of the conductive body or the positional relationships between the conductive body and the electrode 3, the amount of change is smaller than the amount of change in electrostatic capacitance depending on the presence/absence of an approaching conductive body. While the detected values also change depending on ambient temperature or humidity, the amount of change is smaller than the amount of change in detected values depending on the presence/absence of an approaching conductive body. The prescribed difference value $\Delta a$ is predetermined by a designer or the like as an intermediate value of the amount of change in detected values depending on the presence/absence of touch operations and the amount of change in detected value due to other factors.

When it has been judged YES in step Sa2 since the detected value difference $\Delta V$ of the check switch is not less than the prescribed difference value $\Delta a$, the CPU 81 proceeds to step Sa3.

In step Sa3, the CPU 81 increments a count value of the check switch by 1. The count values are stored in the RAM 83 wherein sixteen thereof are provided in connection with each of all the touch switches. In this respect, the count values are all cleared to zero when, for instance, the control panel 100 is started up.

In step Sa4, the CPU 81 confirms whether the count value of the check switch is not less than a prescribed value or not. The prescribed value is suitably judged by a designer or the like. When it is judged YES since a corresponding count value of the check switch is not less than the prescribed value, the CPU 81 proceeds to step Sa5.

In step Sa5, the CPU 81 sets an ON flag for the check switch. The ON flag is a piece of data of one bit stored in the RAM 83, wherein, for instance, "1" represents a set state. Sixteen of the ON flags are provided in connection with each of all the touch switches. The ON flag is a flag representing whether an associated touch switch has been touch operated or not wherein a set state represents a state in which touch operation has been made. In other words, the CPU 81 judges at this time that the check switch is in a touch operated state and sets the ON flag to a set state. Thereafter, the CPU 81 proceeds to step Sa1.

By the way, when it is judged NO in step Sa2 since the detected value difference $\Delta V$ for the check switch is less than the prescribed difference value $\Delta a$, the CPU 81 proceeds to step Sa6.

In step Sa6, the CPU 81 resets the ON flag of the check switch. However, the ON flag of the check switch might already be in a reset state at this time, and it does not necessarily mean that the ON flag state is updated. Thereafter, the CPU 81 proceeds to step Sa7.

In step Sa7, the CPU 81 clears the count value of the check switch to zero. In other words, upon setting or resetting the ON flag, the CPU 81 clears the counter value. Thereafter, the CPU 81 proceeds to step Sa8.

In this respect, when it is judged NO in step Sa4 since the count value of the check value is less than the prescribed value, the CPU 81 skips steps Sa5 and Sa6 and proceeds to step Sa8. In other words, the CPU 81 either changes the ON flag state of the check switch or the count value of the check switch remains the value that has been updated in step Sa3.

In step Sa8, the CPU 81 confirms whether there is any touch switch of all the touch switches comprised by the control panel 100 that has not been selected in the current touch judgment processes or not. When it is judged NO since any unselected touch switches are left, the CPU 81 returns to step Sa1 and repeats the above-mentioned processes using other touch switches as the check switch. When it is judged YES in step Sa8 since no unselected touch switches are left, the CPU 81 terminates the current touch judgment process.

In this manner, in a single touch judging process, it is confirmed for each of the touch switches whether the detected value difference $\Delta V$ is not less than the prescribed difference value $\Delta a$, a count value of touch switches of which the detected value difference $\Delta V$ is not less than the prescribed difference value $\Delta a$ are incremented by 1, and it is judged that touch switches which count values after increment has become not less than the prescribed value are in touch operated states. In this respect, since count values represent the number of continuous times in which the detected value difference $\Delta V$ is in a state in which it is not less than the prescribed difference value $\Delta a$, it is judged that the touch switch is in a touch operated state when the state in which the detected value difference $\Delta V$ is not less than the prescribed difference value $\Delta a$ has continued for a prescribed number of times.

The CPU 81 functions as a judging unit by executing the above touch judging process.

Figure 6:
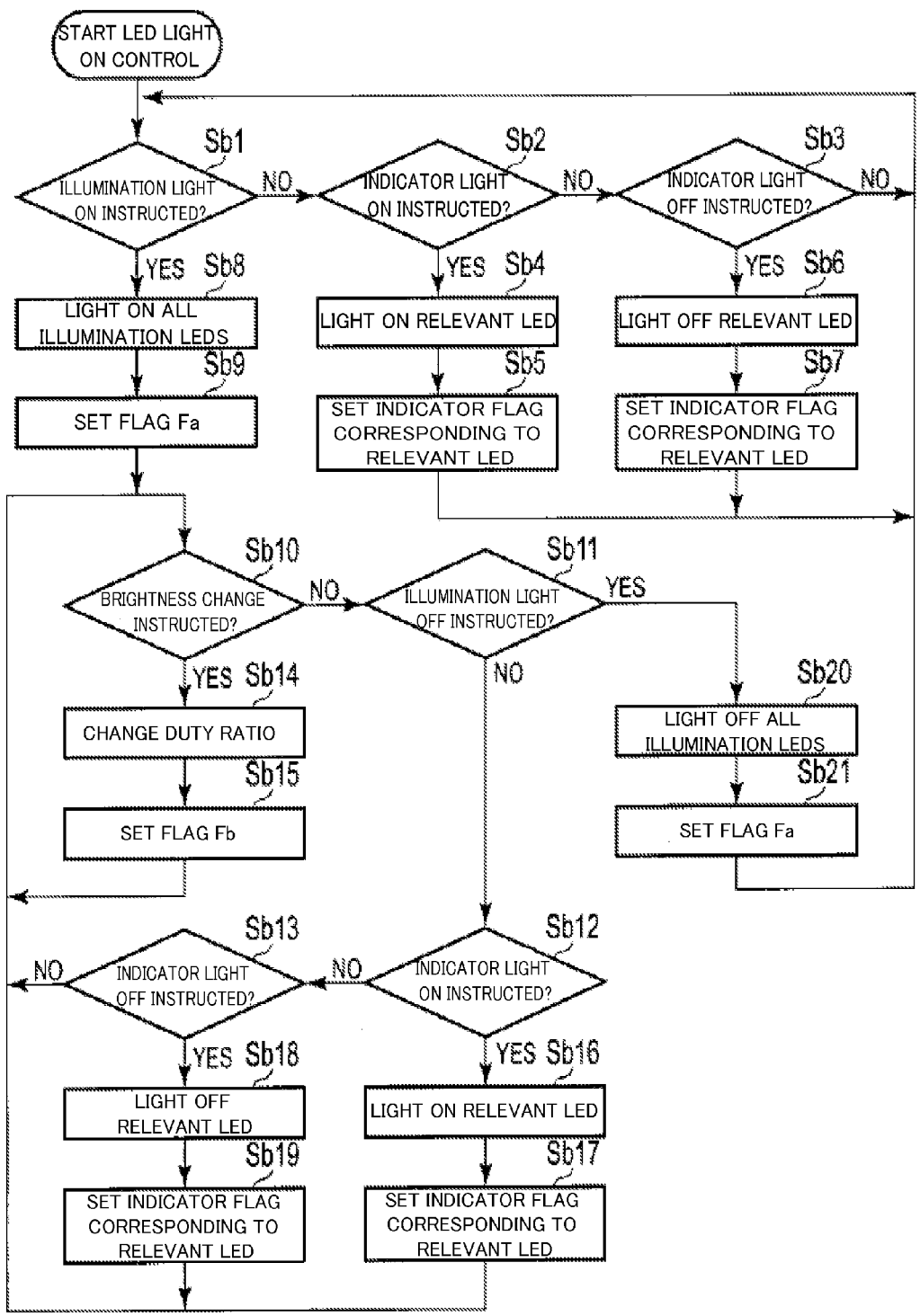
FIG. 6 is a flowchart of LED (light-emitting diode) lighting control of a first operating example performed by the CPU in FIG. 3.

On the other hand, the CPU 81 starts LED lighting control as shown in FIG. 6 after startup and initialization processes or the like have been completed. The CPU 81 is capable of serially processing LED lighting control and the touch judging process by processing LED lighting control as another task different from the touch judging process.

The LED lighting control is a process for controlling the lighted state of the light-emitting diodes 4, 5. When the CPU 81 starts LED lighting control, all light-emitting diodes 4, 5 are in a light OFF state.

In step Sb1, the CPU 81 confirms whether illumination light ON has been instructed or not. This instruction of illumination light ON and other instructions that are to be described later are made, for instance, from a controller of a vehicle to which the control panel 100 is mounted. When it is judged NO since no instruction of illumination light ON has been made, the CPU 81 proceeds to step Sb2.

In step Sb2, the CPU 81 confirms whether indicator light ON has been instructed or not. When it is judged NO since no instruction has been made, the CPU 81 proceeds to step Sb3.

In step Sb3, the CPU 81 confirms whether indicator light OFF has been instructed or not. When it is judged NO since no instruction has been made, the CPU 81 proceeds to step Sb1.

In steps Sb1 to Sb3, the CPU 81 accordingly awaits that any one of illumination light ON, indicator light ON or indicator light OFF is instructed. Upon receiving either one instruction for the indicator, the CPU 81 judges YES in step Sb2 and proceeds to step Sb4.

In step Sb4, the CPU 81 instructs the driving circuit 7*b* corresponding to a light-emitting diode 5, which corresponds to the indicator as designated in the above instruction, to light the light-emitting diode 5 ON. Upon receiving this instruction, the driving circuit 7*b* drives the light-emitting diode 5 to be in a light ON state. PWM control is used for this driving.

In step Sb5, the CPU 81 sets an indicator flag Fc corresponding to the above light-emitting diode 5 lighted ON. The indicator flag Fc is a piece of data of one bit stored in the RAM 83, wherein, for instance, "1" represents a set state. Seven indicator flags Fc-8, Fc-9, Fc-10, Fc-11, Fc-12, Fc-15, Fc-16 corresponding to each of the seven light-emitting diodes 5-8, 5-9, 5-10, 5-11, 5-12, 5-15, 5-16 are provided as the indicator flag Fc in the RAM 83. In this respect, the indicator flag Fc is reset at a timing irrespective of LED lighting control in a reference value updating process that is to be described later. It might accordingly be that step Sb5 is executed during a period in which a set indicator flag Fc is reset by the reference value updating process in which case the indicator flag Fc is in an already set state.

More particularly, when instructions are made in accordance with setting the interior air circulation mode to light a related indicator ON, the CPU 81 lights the light-emitting diode 5-10 ON and sets the indicator flag Fc-10.

Thereafter, the CPU 81 returns to the standby state of steps Sb1 to Sb3.

Upon receiving an instruction of lighting any one of the indicators OFF in the standby state of steps Sb1 to Sb3, the CPU 81 judges YES in step Sb3 and proceeds to step Sb6.

In step Sb6, the CPU 81 instructs the driving circuit 7*b* that corresponds to the light-emitting diode 5, which corresponds to the indicator designated in the above instruction, to light the light-emitting diode 5 OFF. Upon receiving this instruction, the driving circuit 7*b* terminates driving of the light-emitting diode 5.

In step Sb7, the CPU 81 sets an indicator flag Fc corresponding to the above light-emitting diode 5 which has been lighted OFF.

More particularly, when light OFF of a corresponding indicator has been instructed in accordance with resetting the interior air circulation mode, the CPU 81 lights the light-emitting diode 5-10 OFF and also sets the indicator flag Fc-10. Due to the same reason as described above, it might be that a corresponding indicator flag Fc is already in a set state at the time of executing step Sb7.

Thereafter, the CPU 81 returns to the standby state of steps Sb1 to Sb3.

In this manner, when a lighting state of any of the light-emitting diodes 5 is changed, an indicator flag Fc corresponding to the light-emitting diode 5 is set.

When light ON of an illumination on the control panel 100 is instructed in the standby state of steps Sb1 to Sb3, the CPU 81 determines YES in step Sb1 and proceeds to Step Sb8. In this respect, light ON of an illumination is instructed, for instance, in accordance with switching a light switch of the vehicle ON.

In step Sb8, the CPU 81 instructs all driving circuits 7*a* to light all light-emitting diodes 4 ON.

In step Sb9, the CPU 81 sets an illumination flag Fa. The illumination flag Fa is a piece of data of one bit stored in the RAM 83 wherein, for instance, "1" represents a set state. In this respect, the illumination flag Fa is reset at a timing irrespective of LED lighting control in the reference value updating process as it will be discussed later. It might accordingly be that step Sb9 is executed during a period in which a set illumination flag Fa is reset by the reference value updating process in which case the illumination flag Fa is in an already set state.

In step Sb10, the CPU 81 confirms whether brightness change has been instructed or not. If it is judged NO since no instruction has been made, the CPU 81 proceeds to step Sb11.

In step Sb11, the CPU 81 confirms whether light OFF of an illumination on the control panel 100 has been instructed or not. When it is judged NO since no instruction has been made, the CPU 81 proceeds to step Sb12.

In step Sb12, the CPU 81 confirms whether indicator light ON has been instructed or not. If it is judged NO since no instruction has been made, the CPU 81 proceeds to step Sb13.

In step Sb13, the CPU 81 confirms whether indicator light OFF has been instructed or not. When it is judged NO since no instruction has been made, the CPU 81 returns to step Sb10.

In steps Sb10 to Sb13, the CPU 81 thus awaits that any one of brightness change, illumination light ON, indicator light ON and indicator light OFF is instructed. Upon receiving a brightness changing instruction, the CPU 81 judges YES in step Sb10 and proceeds to step Sb14.

In step Sb14, the CPU 81 evenly changes the duty ratio for PWM control of all driving circuits 7*a*, 7*b* in accordance with an amount of change as designated in the above instruction. In this respect, it is also possible not to change the duty ratio of the driving circuits 7*b*.

In step Sb15, the CPU 81 sets a light control flag Fb. The light control flag Fb is a piece of data of one bit stored in the RAM 83, wherein, for instance, "1" represents a set state. In this respect, the light control flag Fb is reset at a timing irrespective of LED lighting control in the reference value updating process as it will be discussed later. It might accordingly be that step Sb15 is executed during a period in which a set light control flag Fb is reset by the reference value updating process in which case the light control flag Fb is in an already set state.

Thereafter, the CPU 81 returns to the standby state of steps Sb10 to Sb13.

Upon receiving an instruction of lighting any of the indicators ON in the standby state of steps Sb10 to Sb13, the CPU 81 judges YES in step Sb12 and proceeds to step Sb16.

In step Sb16, the CPU 81 instructs a driving circuit 7*b* corresponding to a light-emitting diode 5 to light the light-emitting diode 5, which corresponds to the indicator that has been designated by the above instruction, ON.

In step Sb17, the CPU 81 sets an indicator flag Fc corresponding to the above light-emitting diode 5 that has been lighted ON.

Thereafter, the CPU 81 return to the standby state of step Sb10 to Sb13.

When light OFF of any one indicator is instructed in the standby state of steps Sb10 to Sb13, the CPU 81 judges YES in step Sb13 and proceeds to step Sb18.

In step Sb18, the CPU 81 instructs a driving circuit 7*b* corresponding to a light-emitting diode 5 to light the light-emitting diode 5, which corresponds to the indicator that has been designated by the above instruction, OFF.

In step Sb19, the CPU 81 sets an indicator flag Fc corresponding to the above light-emitting diode 5 that has been lighted OFF.

Thereafter, the CPU 81 returns to the standby state of step Sb10 to Sb13.

When light OFF of any one illumination is instructed in the standby state of steps Sb10 to Sb13, the CPU 81 judges YES in step Sb11 and proceeds to step Sb20. In this respect, light OFF of an illumination is instructed in accordance with, for instance, switching a light ON switch of vehicle lights OFF.

In step Sb20, the CPU 81 instructs all driving circuits 7a to light all light-emitting diodes 4 OFF.

In step Sb21, the CPU 81 sets an illumination flag Fa.

Thereafter, the CPU 81 returns to the standby state of steps Sb1 to Sb3.

In this manner, while the light ON states of the light-emitting diodes 4, 5 are suitably changed in accordance with various instructions, a illumination flag Fa is set when light ON/OFF of a light-emitting diode 4 is changed, a brightness flag Fb is set when the duty ratio for PWM control is changed, and an indicator flag Fc of a corresponding light-emitting diode is set when light ON/OFF of the light-emitting diode 5 is changed, respectively.

Figure 7:
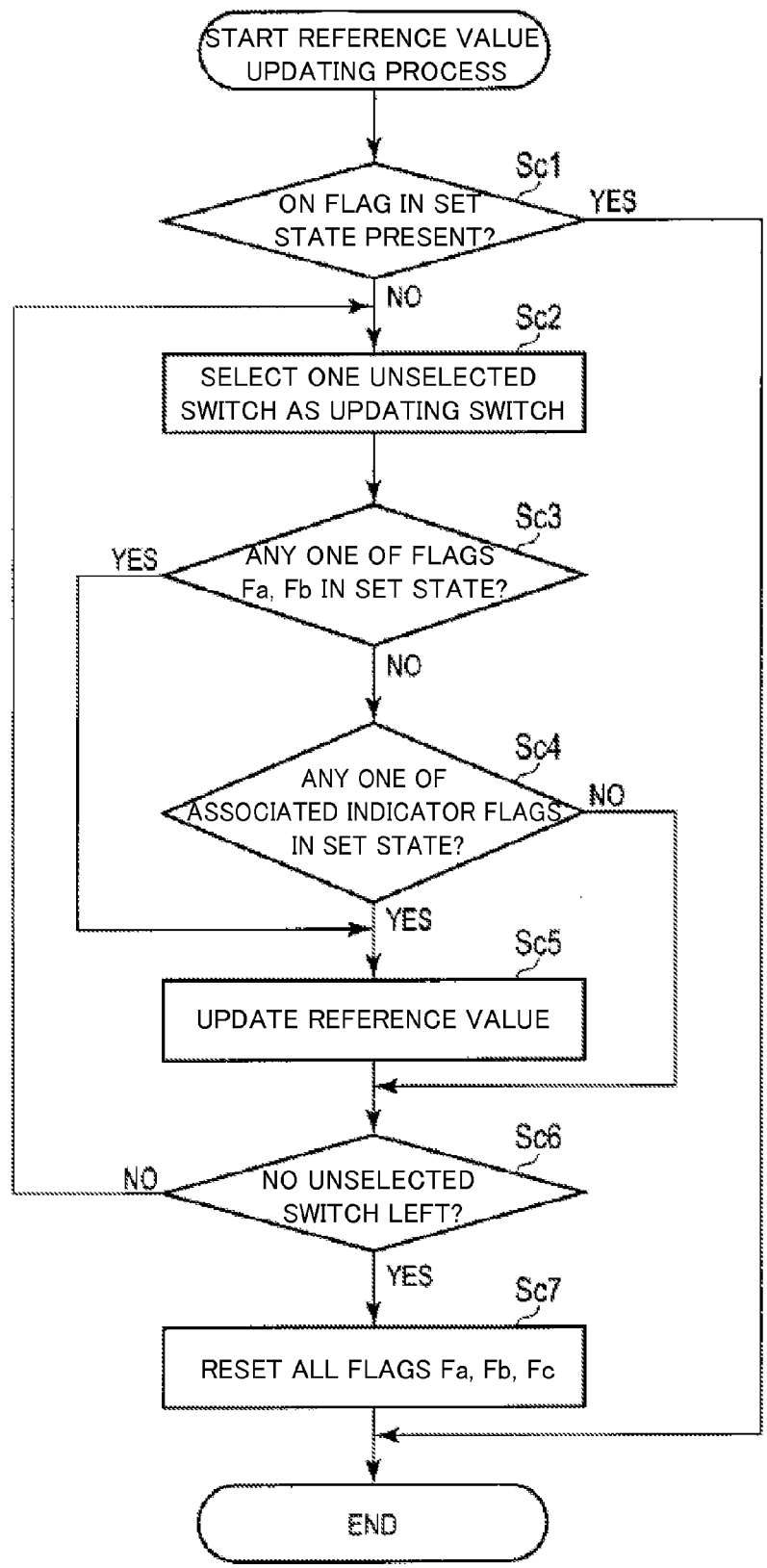
FIG. 7 is a flowchart of a reference value updating process performed by the CPU in FIG. 3.

Further, the CPU 81 repeatedly starts reference value updating processes as shown in FIG. 7 at constant time intervals. In this respect, the timing for starting the reference value updating process might be irrespective of the timing for starting the touch judging process, and the interval of executing the reference updating process is typically larger than the interval of executing the touch judging process. The interval of executing the reference updating process and the interval of executing the touch judging process are preliminarily and suitably determined by a designer or the like.

By performing the reference value updating process as a different task than the LED light ON control or the touch judging process, the CPU 81 can serially perform these processes.

In step Sc1, the CPU 81 confirms whether there is any one of the ON flags corresponding to each of the touch switches in a set state. If it is judged NO since all ON flags are in a reset state, the CPU 81 proceeds to step Sc2.

In step Sc2, the CPU 81 selects one out of all touch switches comprised by the control panel 100 that has not been selected yet in the current reference value updating process as an updating switch.

In step Sc3, the CPU 81 confirms whether either one of the illumination flag Fa or the brightness flag Fb is in a set state or not. When it is judged NO since both of the illumination flag Fa and the brightness flag Fb are in reset states, the CPU 81 proceeds to step Sc4.

In step Sc4, the CPU 81 confirms whether there is any indicator flag Fc that is associated with the operating portion numbers of the operating portions 2 included in the updating switch by the flag associating table in a set state. When there is any corresponding indicator flag Fc in a set state, it is judged YES and the CPU 81 proceeds to step Sc5.

In this respect, when it is judged YES in step Sc3 since either one of the illumination flag Fa or the brightness flag Fb is in a set state, the CPU 81 skips step Sc4 and proceeds to step Sc5.

In this manner, when there is any one of the illumination flag Fa, the brightness flag Fb or the indicator flag Fc associated with the updating switch in a set state, the CPU 81 proceeds to step Sc5. For instance, when a touch switch including operating portion 2-10 is defined to be the updating switch, the CPU 81 proceeds to step Sc5 when there is any of the illumination flag Fa, the brightness flag Fb or one of the indicator flags Fc-9, Fc-10, Fc-15 and Fc-16 in a set state.

In step Sc5, the CPU 81 updates a reference value stored in the RAM 83 in connection with the updating switch. More particularly, the detecting circuit 6 included in the updating switch acquires a detected value to be output at this time by the interface unit 84 and the CPU 81 rewrites the reference value stored in the RAM 83 in connection with the updating switch using this detected value.

Thereafter, the CPU 81 proceeds to step Sc6. In this respect, when it is judged NO in step Sc4 since all of the indicator flags Fc associated with the updating switch are in a reset state, the CPU 81 skips step Sc5 and proceeds to step Sc6.

In step Sc6, the CPU 81 confirms whether there are any touch switches left unselected in the current reference value updating process from among all touch switches comprised by the control panel 100. When it is judged NO since there are unselected touch switches left, the CPU 81 returns to step Sc2 and repeats the above process using another switch as the updating switch. When it is judged YES in step Sc6 since no unselected touch switches are left, the CPU 81 proceeds to step Sc7.

In step Sc7, the CPU 81 resets all of the illumination flag Fa, the brightness flag Fb and all of the indicator flags Fc. Thereafter, the CPU 81 terminates the reference value updating process.

In this respect, when it is judged YES in step Sc1 since there is any one of the ON flags that correspond to each of the touch switches is a set state, the CPU 81 terminates the reference value updating process without executing any one of steps Sb2 to Sb7.

In this manner, the illumination flag Fa, the brightness flag Fb and all of the indicator flags Fc are reset upon completion of the loop process of steps Sc2 to Sc6. The illumination flag Fa is set when light ON/OFF of a light-emitting diode 4 is changed, the brightness flag Fb is set when the duty ratio for PWM control is changed, and the indicator flag Fc of a corresponding light-emitting diode is set when light ON/OFF of the light-emitting diode 5 is changed, respectively.

When either the illuminating flag Fa or the brightness flag Fb is in a set state, the reference value related to all touch switches is updated. In other words, when the light ON state of an illumination of the control panel 100 is changed or the brightness of the illumination is changed after completion of processes of the loop of steps Sc2 to Sc6 at the previous time, the reference value related to all touch switches is updated.

On the other hand, when both of the illuminating flag Fa and the brightness flag Fb are in a reset state, a reference value related to a touch switch with any one of the associated indicator flags Fc being in a set state is updated. More particularly, a reference value related to a touch switch which light ON state of an indicator of the associated touch switch has been changed after completion of processes of the loop of steps Sc2 to Sc6 at the previous time is updated.

More particularly, when the flag associating table is that as shown in FIG. 4, a reference value related to the touch switch including, for instance, the operating portion 2-10, is changed in accordance with a change in the light ON state of the indicator due to a change in the light ON state of any one of light-emitting diodes 5-9, 5-10, 5-15, 5-16, the reference value is not updated in accordance with a change in the light ON state of the indicator due to a change in the light ON state of any one of light-emitting diodes 5-8, 5-11, 5-12. Further, while a reference value related to the touch switch including, for instance, the operating portion 2-15, is changed in accordance with a change in the light ON state of the indicator due to a change in the light ON state of any one of light-emitting diodes 5-8, 5-9, 5-10, 5-15, 5-16, the reference value is not updated in accordance with a change in the light ON state of the indicator due to a change in the light ON state of any either of the light-emitting diodes 5-11, 5-12. In other words, a reference value related to a certain touch sensor is updated, when a light ON state of either the included light-emitting diode 5 when the touch sensor includes a light-emitting diode 5, or a light-emitting diode 5 included in touch sensors that adjoin the touch sensor in question in three, that is, in vertical, horizontal and oblique directions is changed.

In this manner, the CPU 81 functions as a reference value updating unit by executing the reference value updating process.

In this respect, the flag associating table as shown in FIG. 4 is an example in which a range of a touch sensor adjoining the touch sensor in question in three, that is, vertical, horizontal and oblique directions is a range in which detected values are affected by PWM control of the light-emitting diodes 5. The range in which detected values are affected by PWM control varies in accordance with various conditions such as sensitivity of the detecting circuit 6, such a range shall be preliminarily obtained through experiments and simulations to thus generate a suitable flag associating table based on the obtained results.

Figure 8:
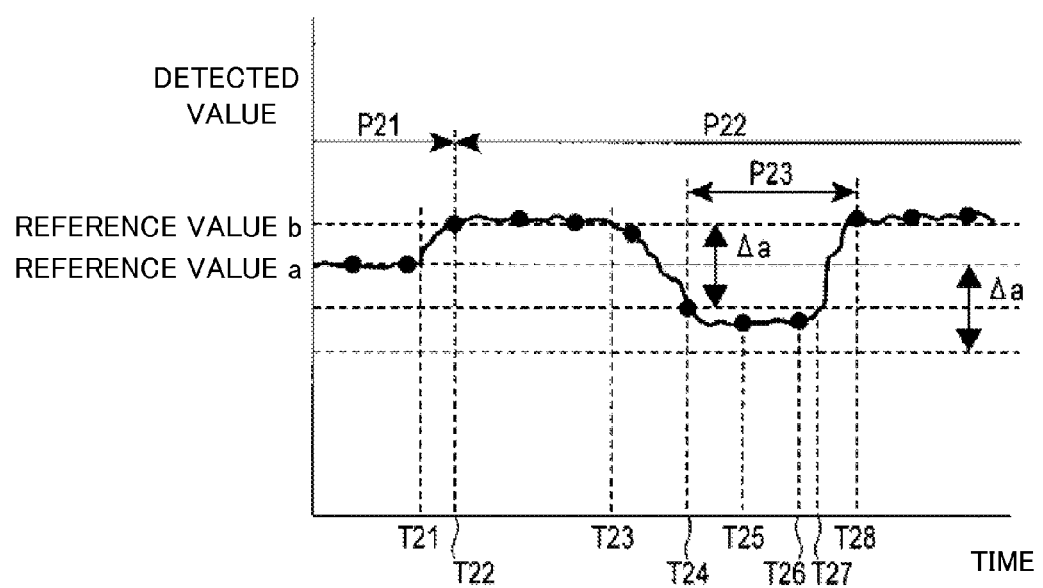
FIG. 8 is a view showing one example of changes in detected values detected by a detecting circuit in FIG. 3.
Figure 9:
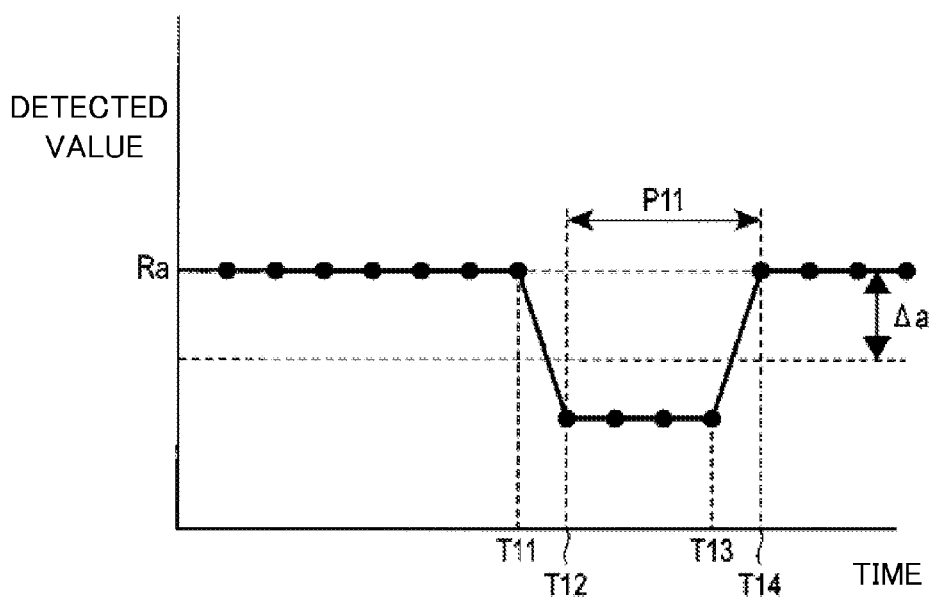
FIG. 9 is a time chart explaining a conventional detecting process of touch operation.

FIG. 8 is a view showing one example of changes in detected values.

In FIG. 8, the thick lines represent changes of values that are to be detected as detected values and the black dots represent values that are detected by the detecting circuit 6. In this respect, the detected circuit 6 here is considered to be included in the touch switch including the operating portion 2-10.

The value at the initial time point shown in FIG. 8 is the reference value a.

At time point T21, PWM control is started in the driving circuit 7 corresponding to the light-emitting diode 5-16 to light it ON, and changes in detected values have already started. At time point T22 at which the next detected value is detected by the detecting circuit 6, the detected value is used to update to reference value b. Thus, the reference value is fixed to reference value a for period P21 while it is fixed to reference value b for period P22 with the time point T22 being held between.

Touch operations are started at time point T23. The detected values consequently reduce, and the differences between the detected values at time points T24, T25, T26 and the reference value b are not less than the prescribed difference value Δa.

Touch operations are terminated at point T27. The detected value consequently increases and the difference between the detected value at time point T28 and the reference value b is less than the prescribed difference value Δa. Thus, it is judged by the CPU 81 that touch operations are made during period P23 ranging from time point T24 to time point T28.

Now, where there is any one from among the ON flags corresponding to each of the touch switches in a set state at the time the reference value updating process is started, that is, when touch operations are being made to any one of the touch switches, the reference value is not updated.

The electrostatic capacitance related to a single touch switch might change also in case no touch operations are made to the touch switch itself but in case touch operations are made to other adjoining touch switches. It is accordingly prevented that a detected value which might possibly be affected by touch operations is set as a reference value.

However, since the illumination flag Fa, the brightness flag Fb and the indicator flag Fc are not reset in case, the reference value is updated when steps Sc2 to Sc6 are executed in accordance with termination of touch operations thereafter in case conditions of updating the reference value are satisfied.

In other words, when conditions of updating the reference value are satisfied and but touch operations are made to any of the touch switches, the CPU 81 performs updating of the reference value upon awaiting termination of the touch operations. With this arrangement, it is possible to set a detected value that has been detected in a state in which it is not affected by touch operations as a reference value and to set a suitable reference value for detecting touch operations.

Second Operating Example

The maximum value of the range of brightness adjustment is defined to be a value that is smaller than the brightness that can be obtained through continuous electrification of the light-emitting diodes 4, 5 in the first operating example. However, the brightness at which the light-emitting diodes 4, 5 are to be lighted is arbitrary, and it is necessary to suitably change operations in accordance with such settings.

An operating example in which the maximum value of the range of brightness of the light-emitting diodes 4 is defined to be 100% (continuous electrification) and in which the brightness of the light-emitting diodes 5 are defined to be 100% and 20% in the light ON state and the light OFF state, respectively, will now be explained.

In this respect, it is the LED light ON control that needs to be mainly changed in accordance with the settings of the brightness of the light-emitting diodes 4, 5 while the touch judging process and the reference value updating process might be the same as in the first operating example. Accordingly, only the LED light ON control will be explained hereinafter.

Figure 10:
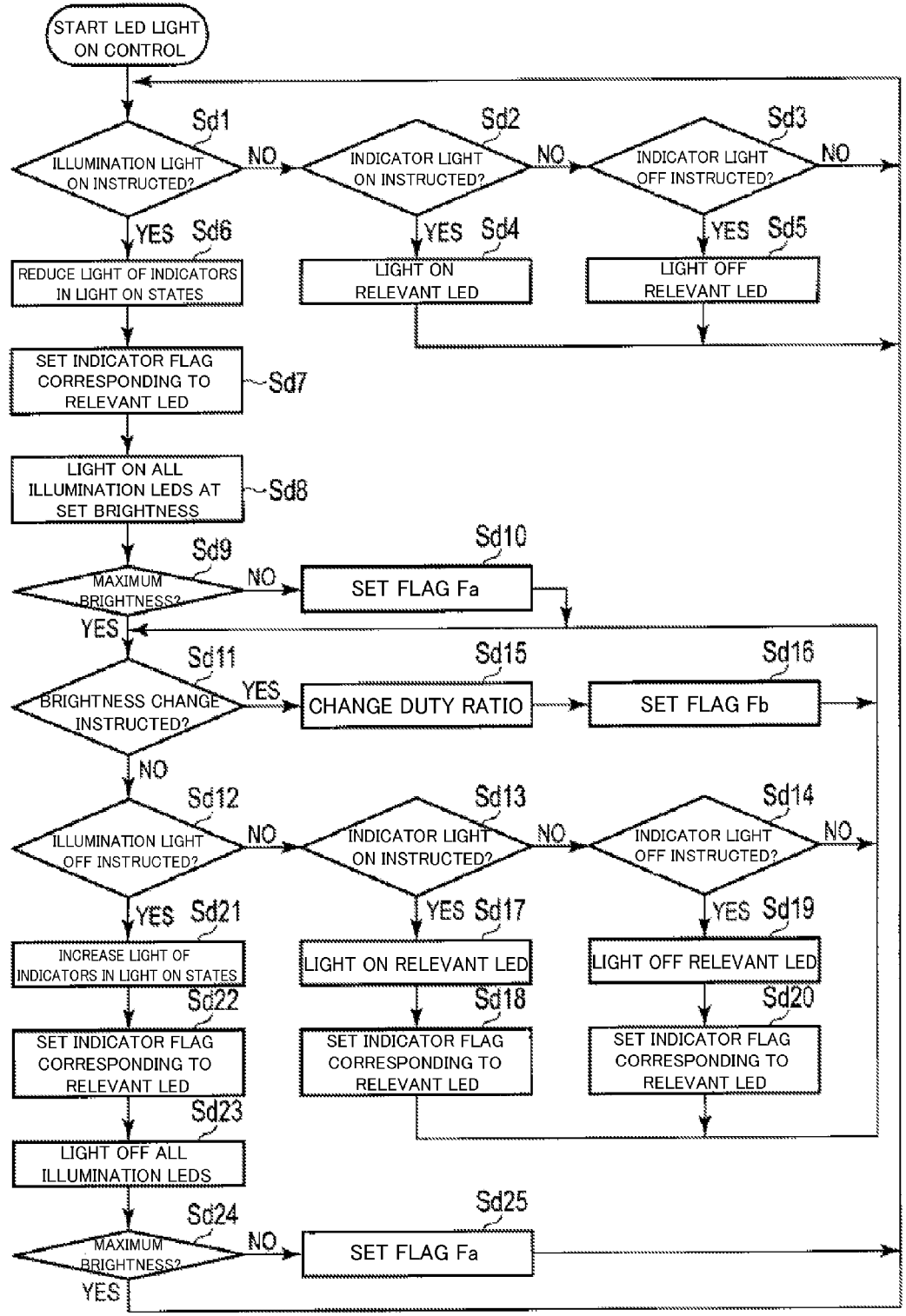
FIG. 10 is a flowchart of LED lighting control of a second operating example performed by the CPU in FIG. 3.

FIG. 10 is a flowchart of the LED light ON control according to the second operating example.

Figure 11:
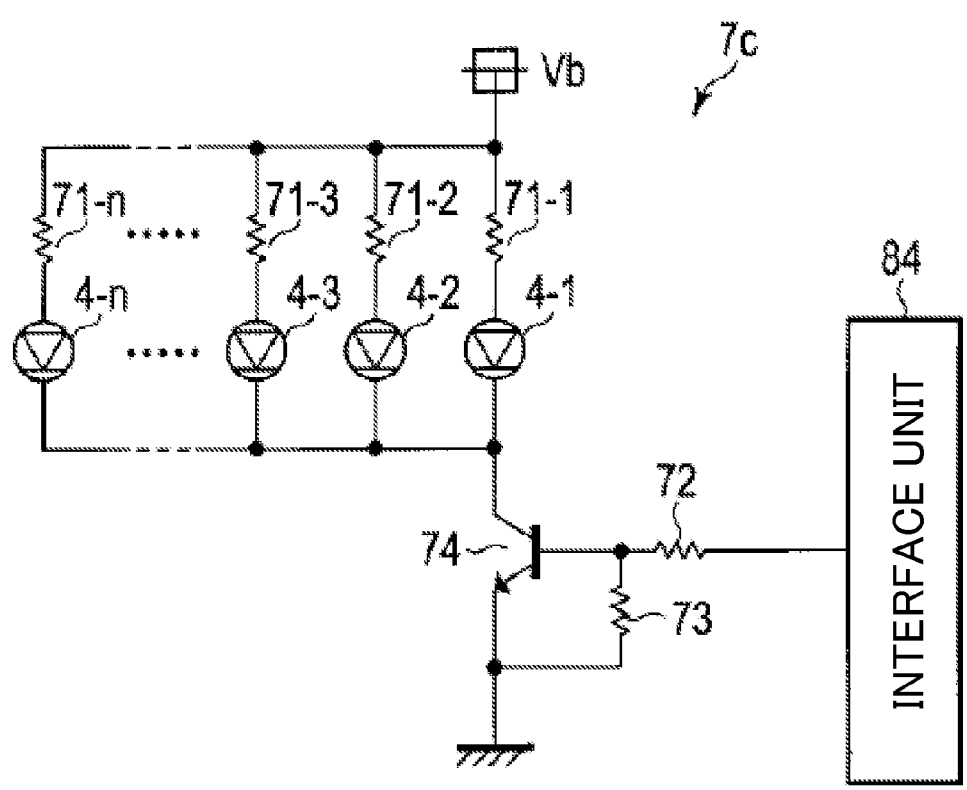
FIG. 11 is a view showing a modified example of a driving circuit.

In the second operating example, the CPU 81 performs the LED light ON control as shown in FIG. 10 and FIG. 11 instead of that of FIG. 6. In this respect, detailed explanations of processes that are identical to those of the processes of FIG. 6 will be omitted in the following explanations.

When the CPU 81 starts LED light ON control, all light-emitting diodes 4, 5 are in light OFF states.

In step Sd1, the CPU 81 confirms whether illumination light ON has been instructed or not. When it is judged NO when no illumination light ON has been instructed, the CPU 81 proceeds to step Sd2.

In step Sd2, the CPU 81 confirms whether indicator light ON has been instructed or not. When it is judged NO when no instruction has been made, the CPU 81 proceeds to step Sd3.

In step Sd3, the CPU 81 confirms whether indicator light OFF has been instructed or not. When it is judged NO since no instruction has been made, the CPU 81 returns to step Sd1.

Thus, the CPU 81 awaits in steps Sd1 to Sd3 that any one of illumination light ON, indicator light ON and indicator light OFF is instructed. Upon receiving an instruction of light ON of any one indicator, the CPU 81 judges YES in step Sd2 and proceeds to step Sd4.

In step Sd4, the CPU 81 instructs a driving circuit 7b corresponding to a light-emitting diode 5 which corresponds to the indicator as designated by the above instruction to light the light-emitting diode 5 ON. Upon receiving this instruction, the driving circuit 7b drives the light-emitting diode 5 to switch it to the light ON state. At this time, the light-emitting diode 4 is in a light OFF state so that the brightness of the light-emitting diode 5 is 100%. Accordingly, driving of the light-emitting diode 5 is performed through continuous electrification, and no PWM control is applied. Thereafter, the CPU 81 returns to the standby state of steps Sd1 to Sd3. In other words, since the PWM control state does not change in this case, the CPU 81 does not set an indicator flag Fc corresponding to the above light-emitting diode 5 that has been lighted ON.

Upon receiving an instruction of lighting any one of the indicators OFF in the standby state of steps Sd1 to Sd3, the CPU 81 judges YES in step Sd3 and proceeds to step Sd5.

In step Sd5, the CPU 81 instructs the driving circuit 7b corresponding to the light-emitting diode 5 which corresponds to the indicator as designated by the above instruction to light the light-emitting diode 5 OFF. Upon receiving this instruction, the driving circuit 7b terminates driving of the light-emitting diode 5. Thereafter, the CPU 81 returns to the standby state of steps Sd1 to Sd3. The above termination of driving is a termination of continuous electrification, and since the PWM control state is not changed, the CPU 81 does not set an indicator flag Fc corresponding to the above light-emitting diode 5 that has been lighted OFF.

When light ON of an illumination on the control panel 100 is instructed in the standby state of steps Sd1 to Sd3, the CPU 81 judges YES in step Sd1 and proceeds to Step Sd6.

In step Sd6, the CPU 81 reduces light of all indicators that are in the light ON state. More particularly, the CPU 81 instructs the driving circuits 7b corresponding to the respective light-emitting diodes 5 to change the duty ratio related to the driving of the light-emitting diodes 5 in light ON states in order to reduce the brightness of all light-emitting diodes 5 in light ON states from 100% to 20%. With this arrangement, a change is caused in the PWM control state related to the light-emitting diodes 5 in light ON states.

In step Sd7, the CPU 81 respectively sets indicator flags Fc that correspond to the light-emitting diodes 5 in light ON states. In this respect, the indicator flags Fc are reset at a timing irrespective of LED light ON control in performing a reference value updating process as it will be described later. It might accordingly be that step Sd7 is executed during a period in which the set indicator flags Fc are reset by the reference value updating process in which case the indicator flags Fc are already in a set state.

In step Sd8, the CPU 81 instructs all driving circuits 7a to light all light-emitting diodes 4 ON at a set brightness. The set brightness is a brightness that is set by a user, for instance, by a light control switch provided in the vehicle in which the control panel 100 is mounted.

In step Sd9, the CPU 81 confirms whether the set brightness for the light-emitting diode 4 is a maximum brightness or not. When it is judged NO since it is not the maximum brightness, the CPU 81 proceeds to step Sd10.

In step Sd10, the CPU 81 sets the illumination flag Fa. Thereafter, the CPU 81 proceeds to step Sd11. In this respect, when it is judged YES in step Sd9 since the set brightness is the maximum brightness, the CPU 81 proceeds to step Sd11 without executing step Sd10, that is, without setting the illumination flag Fa anew.

In other words, when the set brightness is not the maximum brightness, PWM control is started which unit that a change is caused in the PWM control state so that the illumination flag Fa is set. However, when the set brightness is the maximum brightness, no PWM control is started and no change is caused in the PWM control state so that the illumination flag Fa is not set anew.

In step Sd11, the CPU 81 confirms whether brightness change has been instructed or not. When it is judged NO since no instruction has been made, the CPU 81 proceeds to step Sd12.

In step Sd12, the CPU 81 confirms whether light OFF of an illumination of the control panel 100 has been instructed or not. When it is judged NO since no instruction has been made, the CPU 81 proceeds to step Sd13.

In step Sd13, the CPU 81 confirms whether indicator light ON has been instructed or not. When it is judged NO since no instruction has been made, the CPU 81 proceeds to step Sd14.

In step Sd14, the CPU 81 confirms whether indicator light OFF has been instructed or not. When it is judged NO since no instruction has been made, the CPU 81 returns to step Sd11.

Thus, the CPU 81 awaits in steps Sd11 to Sd14 that any one of brightness change, illumination light OFF, indicator light ON and indicator light OFF is instructed. Upon receiving an instruction of brightness change, the CPU 81 judges YES in step Sd11 and proceeds to step Sd15.

In step Sd15, the CPU 81 evenly changes the duty ratio for PWM control of all driving circuits 7a in accordance with an amount of change as designated in the above instruction.

In step Sd16, the CPU 81 sets the light control flag Fb. Thereafter, the CPU 81 returns to the standby state of steps Sd11 to Sd14.

Upon receiving an instruction of lighting any one of the indicators ON in the standby state of steps Sd11 to Sd14, the CPU 81 judges YES in step Sd13 and proceeds to step Sd17.

In step Sd17, the CPU 81 instructs a driving circuit 7b corresponding to a light-emitting diode 5 that corresponds to the indicator as designated in the above instruction to light the light-emitting diode 5 ON.

In step Sd18, the CPU 81 sets an indicator flag Fc corresponding to the above light-emitting diode 5 that has been lighted ON.

Thereafter, the CPU 81 returns to the standby state of steps Sd11 to Sd14.

Upon receiving an instruction of lighting any one of the indicators OFF in the standby state of steps Sd11 to Sd14, the CPU 81 judges YES in step Sd14 and proceeds to step Sd19.

In step Sd19, the CPU 81 instructs a driving circuit 7b corresponding to a light-emitting diode 5 that corresponds to the indicator as designated in the above instruction to light the light-emitting diode 5 OFF.

In step Sd20, the CPU 81 sets an indicator flag Fc corresponding to the above light-emitting diode 5 that has been lighted OFF.

Thereafter, the CPU 81 returns to the standby state of steps Sd11 to Sd14.

Upon receiving an illumination light OFF instruction in the standby state of steps Sd11 to Sd14, the CPU 81 judges YES in step Sd12 and proceeds to step Sd21.

In step Sd21, the CPU 81 increases the light of all indicators in a light ON state. More particularly, the CPU 81 instructs the driving circuits 7b corresponding to the respective light-emitting diodes 5 to change the duty ratio related to the driving of the light-emitting diodes 5 in light ON states in order to increase the brightness of all light-emitting diodes 5 in light ON states from 20% to 100%. With this arrangement, the PWM control that had been performed for the light-emitting diodes 5 in light ON states is terminated and a change in caused in the PWM control state.

In step Sd22, the CPU 81 respectively sets indicator flags Fc corresponding to the light-emitting diodes 5 in light ON state. In this respect, the indicator flags Fc are reset at a timing irrespective of LED light ON control in performing a reference value updating process as it will be described later. It might accordingly be that step Sd22 is executed during a period in which the set indicator flags Fc are reset by the reference value updating process in which case the indicator flags Fc are already in a set state.

In step Sd22, the CPU 81 instructs all driving circuits 7a to light all light-emitting diodes 4 OFF.

In step Sd24, the CPU 81 confirms whether the set brightness for the light-emitting diode 4 is a maximum brightness or not. When it is judged NO since it is not the maximum brightness, the CPU 81 proceeds to step Sd25.

In step Sd25, the CPU 81 sets the illumination flag Fa. Thereafter, the CPU 81 returns to the standby state of steps Sd1 to Sd3. In this respect, when it is judged YES in step Sd24 since the set brightness is the maximum brightness, the CPU 81 returns to the standby state of steps Sd1 to Sd3 without executing step Sd25, that is, without setting the illumination flag Fa anew.

In other words, when the set brightness is not the maximum brightness, PWM control is terminated which unit that a change is caused in the PWM control state so that the illumination flag Fa is set. However, when the set brightness is the maximum brightness, no PWM control is started and no change is caused in the PWM control state so that the illumination flag Fa is not set anew.

By performing LED light ON control in the above-described manner, it is possible to achieve the same effects as in the first operating example while coping with operations under conditions as recited at the beginning of the present operating example.

In this respect, the present invention is not limited to the above embodiments but modified embodiments as follows are possible.

It is not necessarily required to provide separate driving circuits 7a for each of the operating portions 2-1 to 2-16, but it is also possible to drive some of the light-emitting diodes 4-1 to 4-16 by a single driving circuit.

FIG. 11 is a view showing a configuration of a driving circuit 7c as described above. In this respect, elements in FIG. 11 that are identical to those of FIG. 3 are marked with the same reference numbers.

In the driving circuit 7c, a circuit in which each of serially-connected re-numbers of light-emitting diodes 4-1, 4-2, 4-3, ..., 4-n and resistors 71-1, 71-2, 71-3, ..., 71-n are further connected in parallel is provided between a power source line of voltage Vb and a collector of the transistor 74.

With this arrangement, the light-emitting diodes 4-1 to 4-n are simultaneously lighted ON/OFF at the same time in accordance with switching the transistor 74 ON/OFF, and light at the same brightness at the same duty ratio when they are in the light ON state.

In this respect, while FIG. 11 shows a case in which the n is 4 or more, n could be an arbitrary number of not less than 2 and not more than the total number of light-emitting diodes. In case of the control panel 100 of the above embodiment, when n is defined to be 16, it is possible to drive all of the light-emitting diodes 4-1 to 4-16 by a single driving circuit 7c.

Contents of the above-described touch judging process, the LED light ON control and the reference number updating process are just examples, and various processes with which it is possible to obtain similar results can be suitably utilized.

The configuration as shown in FIG. 2 is an example employing a so-called self-capacitance method, but the above-described embodiment can be utilized as it is also when employing a mutual capacitance method.

The number and arrangement of touch switches that are comprised by the control panel can be arbitrary.

It is also possible to reverse the order of step Sc1 and step Sc2 of the reference value updating process and to confirm in step Sc1 whether the updating switch is being touch operated or not. In other words, it is also possible to perform updating of the reference value also when touch operations are being made to touch switches other than the updating switch.

It is also possible to reverse the order of step Sc1 and step Sc2 of the reference value updating process and to confirm whether touch operations are being made to touch switches which are in specified positional relationships with respect to the updating switch. In other words, it is possible to employ an arrangement in which no updating of the reference value is performed only when touch operations are being made to neighboring touch switches while the reference value is updated when touch operations are being made to touch switches which are remoter therefrom. In other words, depending on the arrangement of a plurality of touch switches, it might be that some touch switches are not affected by touch operations to other touch switches that are located far therefrom. Accordingly, it is possible to improve possibilities of performing rapid updating of reference values in such a case by ignoring the presence/absence of touch operations to not-affecting touch switches. More particularly, it is possible to confirm in step Sc1 for a touch switch, for instance, including the operating portion 2-11 whether touch operations are being made to any of the operating portions 2-5, 2-6 and 2-12 or not.

It goes without saying that other various modifications are possible without departing from the gist of the present invention.

REFERENCE MARKS IN THE DRAWINGS 2 (2-1 to 2-16) operating portion
3 (3-1 to 3-16) electrode
4 (4-1 to 4-16), 5 (5-8 to 5-12, 5-15, 5-16) light-emitting diode
6 (6-1, 6-16) detecting circuit
7a, 7b, 7c driving circuit
8 control unit
21 symbol
22 indicator window
81 CPU
82 ROM
83 RAM
100 control panel

The invention claimed is:

1. A control panel comprising a plurality of touch switches and a control unit, each touch switch of the plurality of touch switches comprising:
   operating portions that are subject to touch operations by a conductive body,
   electrodes disposed proximate of the operating portions,
   light-emitting elements that light up the operating portions,
   a first brightness adjusting unit that performs brightness adjustment of the light-emitting elements through PWM (pulse width modulation) control, and
   a detecting circuit that outputs a detected value in accordance with electrostatic capacitances of the electrodes,
   a part of the plurality of touch switches further comprising:
   light-emitting elements for indicators representing states of functions allotted to the operating portions through lighting states, and
   a second brightness adjusting unit that performs brightness adjustment of the light-emitting elements for indicators through PWM control, the control unit comprising:
a memory device that stores reference values for each of the plurality of touch switches,
a judging unit that judges for each of the plurality of touch switches that a touch operation has been made for a corresponding touch switch when a difference between a detected value detected by the detecting circuit that the corresponding touch switch comprises and a reference value for the corresponding touch switch that is stored in the memory device is not less than a prescribed value, and
a reference value updating unit that stores a detected value, which is the first value detected by the detecting circuit after transition of the executing state of the PWM control by the first brightness adjusting unit, or a detected value, which is the first value detected by the detecting circuit, which is comprised by a touch switch that is in a specified positional relationship with respect to the touch switch which executing state of PWM control by the second brightness adjusting unit has changed, after transition of the executing state of the PWM control by the second brightness adjusting unit, in the memory device as the reference value for the touch switch comprising the detecting circuit.

2. The control panel as claimed in claim 1, wherein the reference value updating unit does not update the reference value of a touch switch which is not in the specified positional relationship with the touch switch which executing state of PWM control by the second brightness adjusting unit has changed.

3. The control panel as claimed in claim 1, wherein when the judging unit judges that the touch operation has been made to any of the plurality of touch switches when the detecting circuit makes a first detection after transition of the executing state of PWM control by the first or second brightness adjusting unit, the reference value updating unit stores the first detected value, which is detected by the detecting circuit after the judging unit has judged that no touch operation have been made to any of the plurality of touch switches thereafter, as the reference value in the memory device.

4. The control panel as claimed in claim 1, wherein the reference value updating unit confirms for each of the plurality of touch switches whether any one of a part of touch switches, which are preliminarily determined for each of the touch switches is in a peripheral touched state for which it is judged by the judging unit that they are being touch operated are not, and stores the first detected value, which is detected by the detecting circuit after the peripheral touched state has been cancelled for the touch switches in the peripheral touched state thereafter, as the reference value in the memory device.

* * * * *